United States Patent
Nakayama et al.

(10) Patent No.: US 8,870,352 B2
(45) Date of Patent: Oct. 28, 2014

(54) PIEZOELECTRIC DEVICE AND METHOD FOR MANUFACTURING THE SAME, PIEZOELECTRIC ACTUATOR, LIQUID EJECTING HEAD, AND LIQUID EJECTING APPARATUS

(75) Inventors: Masao Nakayama, Shiojiri (JP); Hideki Hahiro, Shiojiri (JP)

(73) Assignee: Seiko Epson Corporation, Tokyo (JP)

(*) Notice: Subject to any disclaimer, the term of this patent is extended or adjusted under 35 U.S.C. 154(b) by 199 days.

(21) Appl. No.: 12/962,567

(22) Filed: Dec. 7, 2010

(65) Prior Publication Data

US 2011/0134194 A1 Jun. 9, 2011

(30) Foreign Application Priority Data

Dec. 8, 2009 (JP) ................... 2009-278267

(51) Int. Cl.
| | |
|---|---|
| B41J 2/045 | (2006.01) |
| H01L 41/09 | (2006.01) |
| H01L 41/08 | (2006.01) |
| B41J 2/16 | (2006.01) |
| H01L 41/332 | (2013.01) |
| B41J 2/14 | (2006.01) |
| H01L 41/314 | (2013.01) |

(52) U.S. Cl.
CPC ......... *B41J 2/14233* (2013.01); *H01L 41/0973* (2013.01); *H01L 41/0805* (2013.01); *B41J 2/1628* (2013.01); *B41J 2/161* (2013.01); *B41J 2/1642* (2013.01); *H01L 41/332* (2013.01); *H01L 41/314* (2013.01); *B41J 2/1646* (2013.01); *B41J 2/1634* (2013.01); *B41J 2/1631* (2013.01)
USPC ............................................. 347/68; 310/367

(58) Field of Classification Search
USPC ........ 347/68, 71, 72; 310/348, 360, 363–364, 310/367–371
See application file for complete search history.

(56) References Cited

U.S. PATENT DOCUMENTS

| | | | | |
|---|---|---|---|---|
| 7,602,102 | B1 * | 10/2009 | Barber et al. | .................. 310/320 |
| 7,997,695 | B2 * | 8/2011 | Shimada | ......................... 347/70 |
| 8,678,566 | B2 * | 3/2014 | Nakayama et al. | ............. 347/72 |

FOREIGN PATENT DOCUMENTS

| | | | |
|---|---|---|---|
| JP | 2007-195316 A | 8/2007 | |
| JP | 2009-206329 A | 9/2009 | |
| JP | 2011124308 A * | 6/2011 | ............. H01L 41/09 |

* cited by examiner

*Primary Examiner* — Daniel Petkovsek
(74) *Attorney, Agent, or Firm* — Kilpatrick Townsend & Stockton LLP

(57) ABSTRACT

A piezoelectric device includes: a substrate; a first electrode formed over the substrate; a first piezoelectric element formed over the first electrode; a low density region which is formed at a side of the first piezoelectric element and has density lower than that of the first piezoelectric element; a second piezoelectric element which is formed to cover the first piezoelectric element and the low density region; and a second electrode formed over the second piezoelectric element.

7 Claims, 4 Drawing Sheets

PIEZOELECTRIC DEVICE AND METHOD FOR MANUFACTURING THE SAME, PIEZOELECTRIC ACTUATOR, LIQUID EJECTING HEAD, AND LIQUID EJECTING APPARATUS

This application claims a priority to Japanese Patent Application No. 2009-278267 filed on Dec. 8, 2009 which is hereby expressly incorporated by reference herein in its entirety.

BACKGROUND

1. Technical Field

The present invention relates to a piezoelectric device and a method for manufacturing the same, a piezoelectric actuator, a liquid ejecting head, and a liquid ejecting apparatus.

2. Related Art

A piezoelectric device is a device having a characteristic to change its shape by a voltage applied thereto and having a structure in which a piezoelectric element is sandwiched between electrodes. Piezoelectric devices are used for many applications such as a liquid droplet ejecting head of an ink jet printer and various types of actuators.

A piezoelectric device is constructed, for example, by forming a first piezoelectric element on a lower electrode and forming a second piezoelectric element so as to cover the lower electrode and the first piezoelectric element. In such a piezoelectric device, stress concentrates in the vicinity of a side surface of the first piezoelectric element and may cause cracks in the piezoelectric element. A technique that injects ions into the piezoelectric element to form a low active region so as to reduce the stress concentration is disclosed (see JP-A-2007-195316. for example).

SUMMARY

An advantage of some aspects of the invention is to provide a piezoelectric device that can reduce stress in the vicinity of a side surface of a first piezoelectric element with high reliability and a method for manufacturing the piezoelectric device. Another advantage of some aspects of the invention is to provide a piezoelectric actuator, a liquid ejecting head, and a liquid ejecting apparatus, which include the piezoelectric device mentioned above.

A piezoelectric device according to an aspect of the invention includes: a substrate; a first electrode formed over the substrate; a first piezoelectric element formed over the first electrode; a low density region which is formed at a side of the first piezoelectric element and has density lower than that of the first piezoelectric element; a second piezoelectric element which is formed to cover the first piezoelectric element and the low density region; and a second electrode formed over the second piezoelectric element.

With this piezoelectric device, stress in the vicinity of a side surface of the first piezoelectric element can be reduced by the low density region, thus high reliability can be achieved.

In the piezoelectric device according to the aspect of the invention, the side surface of the first piezoelectric element slants at a first angle relative to an upper surface of the substrate, and a side surface of the first electrode slants at a second angle relative to the upper surface of the substrate. The first angle may be larger than the second angle.

With this piezoelectric device, concentration of an electric field at the first electrode can be reduced.

In the piezoelectric device according to the aspect of the invention, the low density region may have voids therein.

With this piezoelectric device, the density of the low density region is surely made lower than that of the first piezoelectric element. Thus the stress can further be reduced.

A method for manufacturing the piezoelectric device according to an aspect of the invention includes: depositing a first electrode layer over a substrate; depositing a first piezoelectric element layer over the first electrode layer; forming a first piezoelectric element through patterning the first piezoelectric element layer; forming a first electrode, following the forming of the first piezoelectric element, through etching the first electrode layer; depositing a second precursor layer that covers the first piezoelectric element and the first electrode; forming a second piezoelectric element layer by heat-treating and crystallizing the second precursor layer; depositing a second electrode layer over the second piezoelectric element layer; and forming a second piezoelectric element and a second electrode that cover the first piezoelectric element and the first electrode, through patterning the second piezoelectric element layer and the second electrode layer. In the forming of the first piezoelectric element, a side surface of the first piezoelectric element is made slanted at a first angle relative to an upper surface of the substrate; further in the forming of the first electrode, a side surface of the first electrode is made slanted at a second angle relative to the upper surface of the substrate; and the first angle is larger than the second angle.

With this method for manufacturing the piezoelectric device, a low density region is formed at a side of the first piezoelectric element. The low density region reduces the stress in the vicinity of the side surface of the first piezoelectric element, thus making it possible to obtain a piezoelectric device having high reliability.

In the method for manufacturing the piezoelectric device according to the invention, the low density region having density lower than that of the first piezoelectric element can be formed by the heat-treating at the side of the first piezoelectric element.

With this method for manufacturing the piezoelectric device, it is possible to obtain a piezoelectric device with high reliability by forming the low density region.

A piezoelectric actuator according to an aspect of the invention includes the piezoelectric device of the invention.

With this piezoelectric actuator, high reliability can be achieved.

A liquid ejecting head according to an aspect of the invention includes the piezoelectric actuator of the invention.

With this liquid ejecting head, high reliability can be achieved.

A liquid ejecting apparatus according to an aspect of the invention includes the liquid ejecting head of the invention.

With this liquid ejecting apparatus, high reliability can be achieved.

BRIEF DESCRIPTION OF THE DRAWINGS

The invention will be described with reference to the accompanying drawings, wherein like numbers reference like elements.

DESCRIPTION OF EXEMPLARY EMBODIMENTS

Preferred embodiments of the invention will be described hereinafter with reference to the drawings.

Piezoelectric Device

Figure 1:
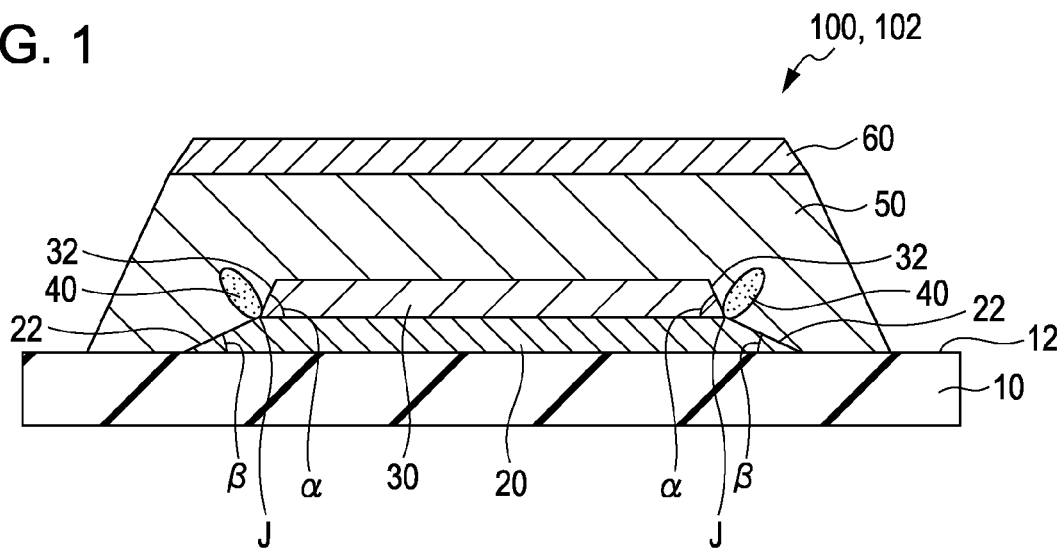
FIG. 1 is a cross-sectional diagram schematically illustrating a piezoelectric device according to an embodiment of the invention.

First, a piezoelectric device 100 according to an embodiment of the invention will be explained with reference to the drawings. FIG. 1 is a cross-sectional diagram schematically illustrating the piezoelectric device 100.

As shown in FIG. 1, the piezoelectric device 100 includes a substrate 10, a first electrode 20, a first piezoelectric element 30, a low density region 40, a second piezoelectric element 50, and a second electrode 60.

A conductor, a semiconductor, an insulator, or the like can be used as a material of the substrate 10. However, since the first electrode 20 is formed on an upper surface 12 of the substrate 10, it is preferable that at least the upper surface 12 of the substrate 10 be an insulator. To be more specific, a single crystal silicon substrate, for example, can be used for the substrate 10.

The substrate 10 may be a vibration plate, for example, that has flexibility and deforms (bends) according to operation of the first piezoelectric element 30 and the second piezoelectric element 50. In this case, the piezoelectric device 100 becomes a piezoelectric actuator 102 that includes the vibration plate, the first electrode 20, the first piezoelectric element 30, the low density region 40, the second piezoelectric element 50, and the second electrode 60. Therefore, the piezoelectric actuator 102 can be read for the piezoelectric device 100 in the descriptions below. In the case where the substrate 10 is a vibration plate, single crystal silicon on which silicon oxide ($SiO_2$) and zirconium oxide ($ZrO_2$) are stacked can be used as a material of the substrate 10, for example.

The first electrode 20 is formed on the substrate 10. As shown in FIG. 1, a side surface 22 of the first electrode 20 slants at a second angle β relative to the upper surface 12 of the substrate 10. The second angle β is an acute angle of, for example, 15 to 40 degrees. Material such as platinum, iridium, a conductive oxide thereof, or a lanthanum nickel oxide ($LaNiO_3$:LNO) can be used as a material of the first electrode 20. The first electrode 20 may have a single layer structure of the above-mentioned material, or a multilayer structure in which multiple materials are stacked. The thickness of the first electrode 20 is, for example, 50 nm to 300 nm. The first electrode 20 is one of the electrodes that apply a voltage to the first piezoelectric element 30 and the second piezoelectric element 50.

A first intermediate layer (not shown) may be interposed between the first electrode 20 and the substrate 20, for example. A titanium layer or the like may be used as the first intermediate layer, for example. The intermediate layer increases adhesiveness between the first electrode 20 and the substrate 10, that is, the first intermediate layer can also serve as an adhesion layer.

The first piezoelectric element 30 is formed on the first electrode 20. A side surface 32 of the first piezoelectric element 30 slants at a first angle α relative to the upper surface 12 of the substrate 10. The first angle α is an acute angle and is larger a second angle β. The first angle α is 45 to 75 degrees, for example. The first piezoelectric element 30 can be made using a piezoelectric material made of perovskite oxide. More specifically, the first piezoelectric element 30 can be made using, for example, lead zirconate titanate ($Pb(Zr,Ti)O_3$: PZT), lead zirconate titanate niobate ($Pb(Zr,Ti,Nb)O_3$: PZTN), or the like. The thickness of the first piezoelectric element 30 is 50 nm to 300 nm, for example.

The low density region 40 is formed at the side of the first piezoelectric element 30. The low density region 40 may be formed at the side of the first electrode 20 (not shown). In FIG. 1, the low density region 40 is formed in contact with a joint portion J of the side surface 32 of the first piezoelectric element 30 and the side surface 22 of the first electrode 20. The number of the low density regions 40 is not specifically limited, nor is the shape of the low density region 40 specifically limited. The density of the low density region 40 is lower than that of the first piezoelectric element 30 and that of the second piezoelectric element 50. The low density region 40 has voids therein and therefore may have a lower density than the first piezoelectric element 30 and the second piezoelectric element 50. Material of the low density region 40 is not specifically limited. The low density region 40 may be in an amorphous state or in porosity (a porous state). A dielectric constant of the low density region 40 may be smaller than that of the first piezoelectric element 30 and that of the second piezoelectric element 50. The grain size of the low density region 40 can be smaller than that of the first piezoelectric element 30 and that of the second piezoelectric element 50.

The second piezoelectric element 50 is formed to cover the first piezoelectric element 30 and the low density region 40. The width (length in a direction perpendicular to the thickness direction) of the second piezoelectric element 50 is at least larger than the width of the first piezoelectric element 30. The material of the second piezoelectric element 50 may be the same as that of the first piezoelectric element 30, for example. The thickness of the second piezoelectric element 50 is 300 to 3,000 nm, for example, which is larger than that of the first piezoelectric element 30.

The first piezoelectric element 30 and the second piezoelectric element 50 can be deformed (driven) when a voltage is applied thereto by the electrodes 20 and 60. In the case where a vibration plate is used as the substrate 10, the substrate 10 can be driven by this deformation and vibrate. Of the first piezoelectric element 30 and the second piezoelectric element 50, a region sandwiched between the first electrode 20 and the second electrode 60 (a region where the first electrode 20 and the second electrode 60 overlap with each other in a plan view) can be considered as a substantial driving portion of the first piezoelectric element 30 and the second piezoelectric element 50. Therefore, the side surface 32 of the first piezoelectric element 30 can be referred to as an edge portion of the driving portion as well.

A second intermediate layer (not shown) may be interposed between the second piezoelectric element 50, and the first piezoelectric element 30, first electrode 20 and substrate 10, for example. A titanium layer or the like can be used as a second intermediate layer. The second intermediate layer can control the orientation of a crystal of the second piezoelectric element 50 formed on the second intermediate layer. Therefore, the second intermediate layer can also serve as an orientation-control layer.

The second electrode 60 is formed on the second piezoelectric element 50. The second electrode 60 is formed on the upper surface of the second piezoelectric element 50 in FIG. 1. The second electrode 60 may further be formed on the side surface of the second piezoelectric element 50 and on the upper surface 12 of the substrate 10. For example, the aforementioned material referred to as the material for the first electrode 30 can be used as a material of the second electrode 60. The thickness of the second electrode 60 is, for example, 50 nm to 300 nm. The second electrode 60 is the other of the electrodes that apply a voltage to the first piezoelectric element 30 and the second piezoelectric element 50.

The piezoelectric device 100 according to the embodiment has the following features.

In the piezoelectric device 100, the low density region 40 is formed at the side of the first piezoelectric element 30. The density of the low density region 40 is lower than that of the first piezoelectric element 30 and that of the second piezoelectric element 50, thereby reducing stress in the vicinity of the side surface 32 of the first piezoelectric element 30. That is, in the case where the low density region 40 is not formed, stress concentrates in a region between the edge portion of the substantial driving portion of the first piezoelectric element 30 and the second piezoelectric element 50 which are sandwiched between the electrodes 20 and 60, and a portion of the second piezoelectric element 50 which is not sandwiched between the electrodes 20 and 60. This stress can cause cracks in the first piezoelectric element 30 and the second piezoelectric element 50. However, according to the embodiment, the stress can be reduced by the low density region 40. Accordingly, the piezoelectric device 100 can suppress occurrence of the cracks and consequently can have high reliability.

In the piezoelectric device 100 of the embodiment, the low density region 40 may have voids therein. Accordingly, the density of the low density region 40 can surely be lower than that of the first piezoelectric element 30 and that of the second piezoelectric element 50, thereby further reducing the stress. In addition, since a layer of low dielectric constant is created with the voids, a voltage applied to a portion of the second piezoelectric element 50 above the low density region 40 is decreased, causing the portion of the second piezoelectric element 50 above the low density region 40 to substantially be a piezoelectric element of a small driving quantity. That is, stress concentration is further reduced in a region between the second piezoelectric element 50 of a small driving quantity which is sandwiched between the vicinity of the side surface 22 of the first electrode 20 and the second electrode 60, and the second piezoelectric element 50 which is not driven and which is not sandwiched between the electrodes 20 and 60.

In the piezoelectric device 100 of the embodiment, the second angle β is smaller than the first angle α. That is, as the side surface 22 of the first electrode 20 is gently sloping, concentration of an electric field is reduced at the edge portion of the first electrode 20, thereby suppressing insulation breakdown (burnout).

Manufacturing of Piezoelectric Device

Next, a method for manufacturing the piezoelectric device 100 according to an embodiment of the invention will be described with reference to the drawings. FIGS. 2 through 6 are cross-sectional diagrams schematically illustrating processes of manufacturing the piezoelectric device 100 according to an embodiment of the invention.

Figure 2:
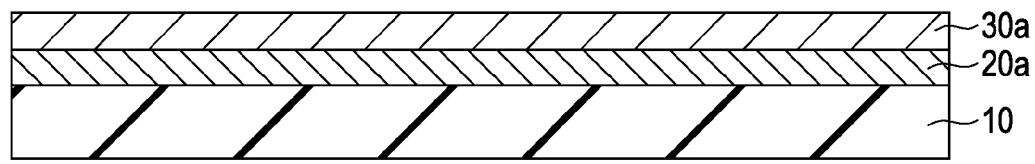
FIG. 2 is a cross-sectional diagram schematically illustrating a manufacturing process of a piezoelectric device according to an embodiment of the invention.

As shown in FIG. 2, a first electrode layer 20a is deposited on the substrate 10. The first electrode layer 20a is formed by such deposition methods as sputtering, plating, vacuum deposition and the like. Then, a first piezoelectric element layer 30a is deposited on the first electrode layer 20a. The first piezoelectric element layer 30a may be crystallized. The first piezoelectric element layer 30a can be deposited by known deposition methods of such as sol-gel, CVD (Chemical Vapor Deposition), MOD (Metal Organic Deposition), sputtering, and laser ablation and the like. Further, the first piezoelectric element layer 30a is crystallized by heat-treating if needed. The heat-treating is carried out, for example, at a temperature of 500 to 800° C. in oxygen atmosphere. Crystallization of the first piezoelectric element layer 30a may be carried out after patterning the first piezoelectric element layer 30a and the first electrode layer 20a.

Figure 3:
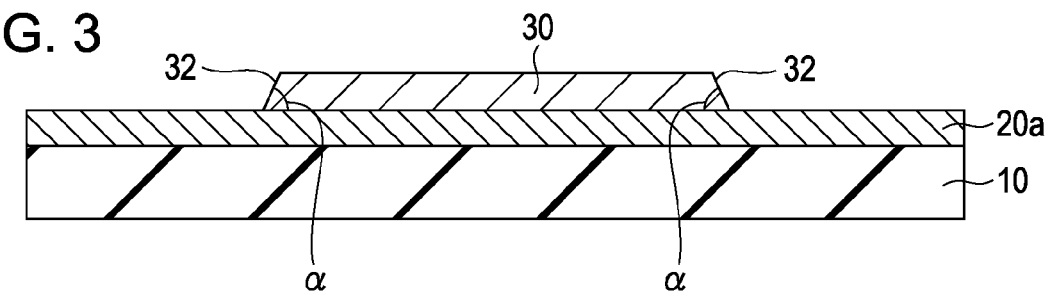
FIG. 3 is another cross-sectional diagram schematically illustrating the manufacturing process of the piezoelectric device according to the embodiment.

As shown in FIG. 3, the first piezoelectric element layer 30a undergoes a patterning process to be the first piezoelectric element 30. The patterning is carried out by such techniques as photolithography and etching. The etching process may be implemented by dry etching using a high-density plasma device such as ICP (Inductively Coupled Plasma). When using the high-density plasma device (a dry etching device), desired etching is achieved by setting the pressure to 1.0 Pa or less. For example, a mixture of a chlorine-based gas and chlorofluorocarbon-based gas (hereinafter, also referred to as "first mixture gas") can be used as an etching gas. By using the first mixture gas, an etching rate of the first piezoelectric element 30 can be made equal to or greater than 200 nm per minute, thereby achieving a high resist selectivity, which is to be approximately 1.0. In addition, the first piezoelectric element 30 is highly reactive particularly with a chlorine gas, and the resist (not shown) which serves as a mask in patterning shows a lower receding rate (etching rate in a direction perpendicular to the thickness direction of the first piezoelectric element 30) with respect to the first mixture gas. Accordingly, the first angle α (a slant angle of the side surface 32 of the first piezoelectric element 30 relative to the upper surface 12 of the substrate 10) can be 45 to 75 degrees when a chlorine-based gas flow ratio is set, for example, to be 40% to 70% in the first mixture gas.

Figure 4:
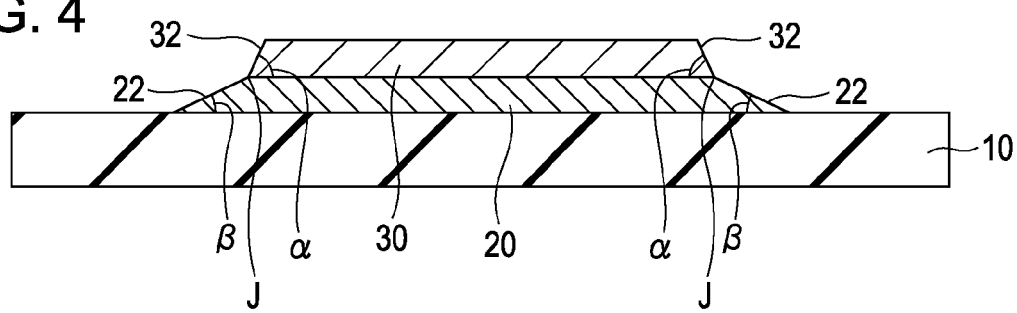
FIG. 4 is still another cross-sectional diagram schematically illustrating the manufacturing process of the piezoelectric device according to the embodiment.

As shown in FIG. 4, the first electrode layer 20a undergoes a patterning process to be the first electrode 20. The patterning process is carried out by techniques such as photolithography and etching. The etching process can be implemented by dry etching using a high-density plasma device such as the ICP. As an etching gas, for example, a mixture of a chlorine-based gas and an argon-based gas (hereinafter, also referred to as "second mixture gas") can be used. The second angle β (a slant angle of the side surface 22 of the first electrode 20 relative to the upper surface 12 of the substrate 10) can be controlled by controlling the receding rates of the resist (not shown) and the first piezoelectric element 30 in the etching process. The second angle β becomes smaller as the receding rates of the resist and the first piezoelectric element 30 (etching rate in a direction perpendicular to the thickness direction of the first electrode layer 20a) becomes higher than that of the first electrode layer 20a. The receding rates of the resist and the first piezoelectric element 30 can be controlled by controlling a chlorine gas flow ratio or the pressure in the second mixture gas. For example, the second angle β can be 15 to 40 degrees if the chlorine gas flow ratio is set to 60% to 80% and the pressure is set to 0.3 Pa to 1.0 Pa in the second mixture gas.

In the case where a multilayer structure made of a Pt layer (lower layer) and an LNO layer (upper layer) formed on the Pt layer is used as the first electrode layer 20a, since an etching rate of the LNO layer is lower than that of the Pt layer with respect to the second mixture gas, a receding rate of the LNO layer becomes low, causing a receding rate of the Pt layer, or the lower layer to be lower. Thus, the receding rate of the first electrode layer 20a becomes further lower than that of the resist and the first piezoelectric element 30; as a result, the second angle β can be made further smaller.

Figure 5:
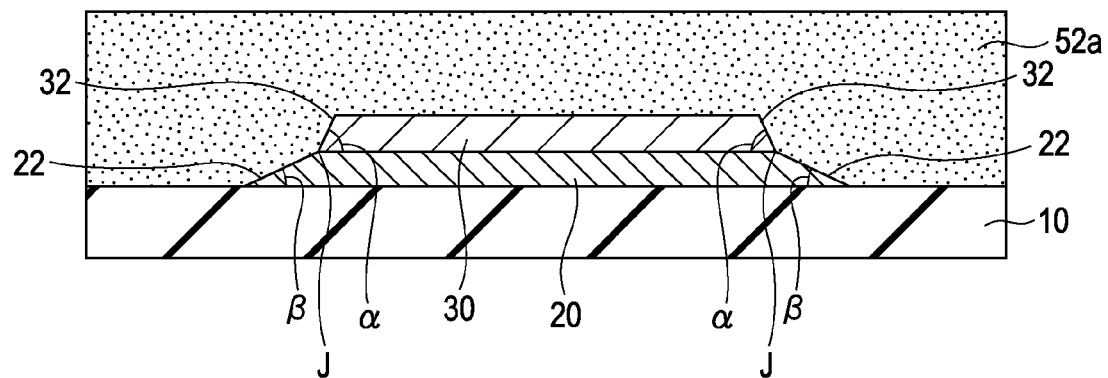
FIG. 5 is further another cross-sectional diagram schematically illustrating the manufacturing process of the piezoelectric device according to the embodiment.

As shown in FIG. 5, a second precursor layer 52a is deposited so as to cover the first piezoelectric element 30 and the first electrode 20. The second precursor layer 52a is deposited in the same method as the first piezoelectric element layer 30a. for example. In this case, the second precursor layer 52a is not crystallized or partially crystallized.

Figure 6:
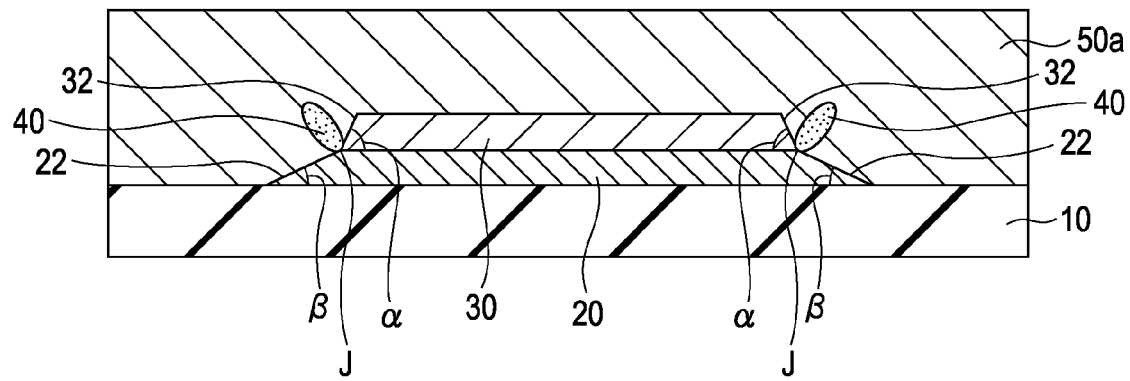
FIG. 6 is still further another cross-sectional diagram schematically illustrating the manufacturing process of the piezoelectric device according to the embodiment.

A heat-treating process is carried out to crystallize the second precursor layer 52a as shown in FIG. 6. The heat-treating process is carried out, for example, at a temperature of 500 to 800° C. in oxygen atmosphere. The second precursor 52a is crystallized through the heat-treating process to become a second piezoelectric element layer 50a. In this heat-treating process, grains of the second piezoelectric element layer 50a first start to grow from the vicinity of the side surface 32 of the first piezoelectric element 30 in a direction perpendicular to the side surface 32 of the first piezoelectric element 30, and keep growing while gradually changing the growing direction toward a direction perpendicular to the substrate 10, thus growing into a columnar structure. On the other hand, grains of the second piezoelectric element layer 50a first start to grow from the vicinity of the side surface 22 of the first electrode 20 in a direction perpendicular to the side surface 22 of the first electrode 20, and keep growing while gradually changing the growing direction toward a direction perpendicular to the substrate 10, thus growing into a columnar structure. Therefore, since these grains grow in different growth directions from each other at first, a collision portion in which the grains collide with each other is generated. The low density region 40 is created in the collision portion. For example, in the collision portion (the low density region 40), the grains of columnar structure of the second piezoelectric element layer 50a may not grow large and become small grains. This brings empty spaces between the grains; as a result, the density of the collision portion becomes lower than that of the first piezoelectric element 30 and that of the second piezoelectric element layer 50a. Moreover, for example, in the collision portion (the low density region 40), the grains try to keep a larger columnar structure. This behavior of the grains brings formation of large empty spaces in the collision portion, and as a result, the density of the collision portion becomes lower than that of first piezoelectric element 30 and that of the second piezoelectric element layer 50a. The low density region 40 may be apt to be generated as the differences in grain growth direction (direction of columnar structure) of grains of the second piezoelectric element layer 50a become larger. That is, the larger the difference between the first angle α and the second angle β is, the more the low density region 40 is apt to be generated. Further, if the sol-gel or MOD method, which causes the volume of a material to contract considerably by heat-treating, is used, the low density region 40 may be formed more appropriately.

Next, a second electrode layer (not shown) is deposited on the second piezoelectric element layer 50a. The second electrode layer is formed by the same deposition method as the first electrode layer 20a. for example.

As shown in FIG. 1, the second electrode 60 and the second piezoelectric element 50 are formed through patterning the second electrode layer and the second piezoelectric element layer 50a. respectively. The patterning is carried out through techniques such as photolithography and etching. The patterning of the second electrode layer and the second piezoelectric element layer 50a can be executed collectively or individually.

The heat-treating process to crystallize the second precursor layer 52a may be conducted after the deposition process of the second electrode layer, or may be conducted after the process of forming the second electrode 60 and the second piezoelectric element 50 by the pattering.

By the processes as described above, the piezoelectric device 100 can be manufactured.

With the method for manufacturing the piezoelectric device 100, as described above, a piezoelectric device with high reliability can be obtained in which the low density region 40 reduces the stress therein.

Liquid Ejecting Head

Figure 7:
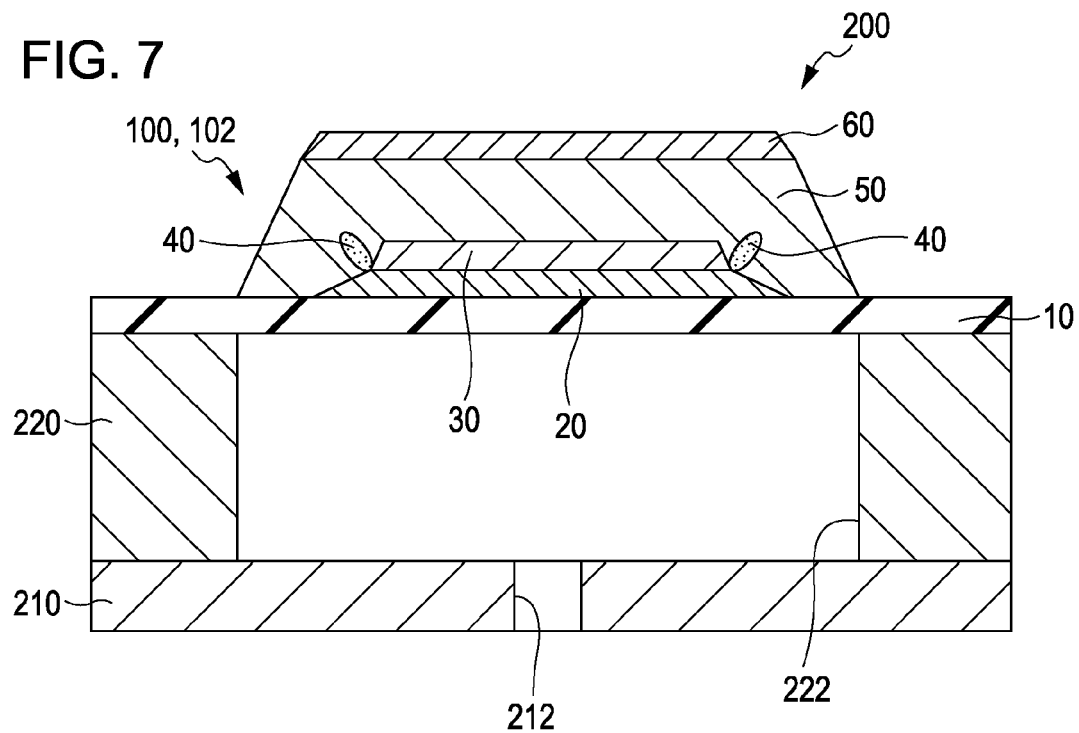
FIG. 7 is a diagram schematically illustrating a liquid ejecting head according to an embodiment of the invention.
Figure 8:
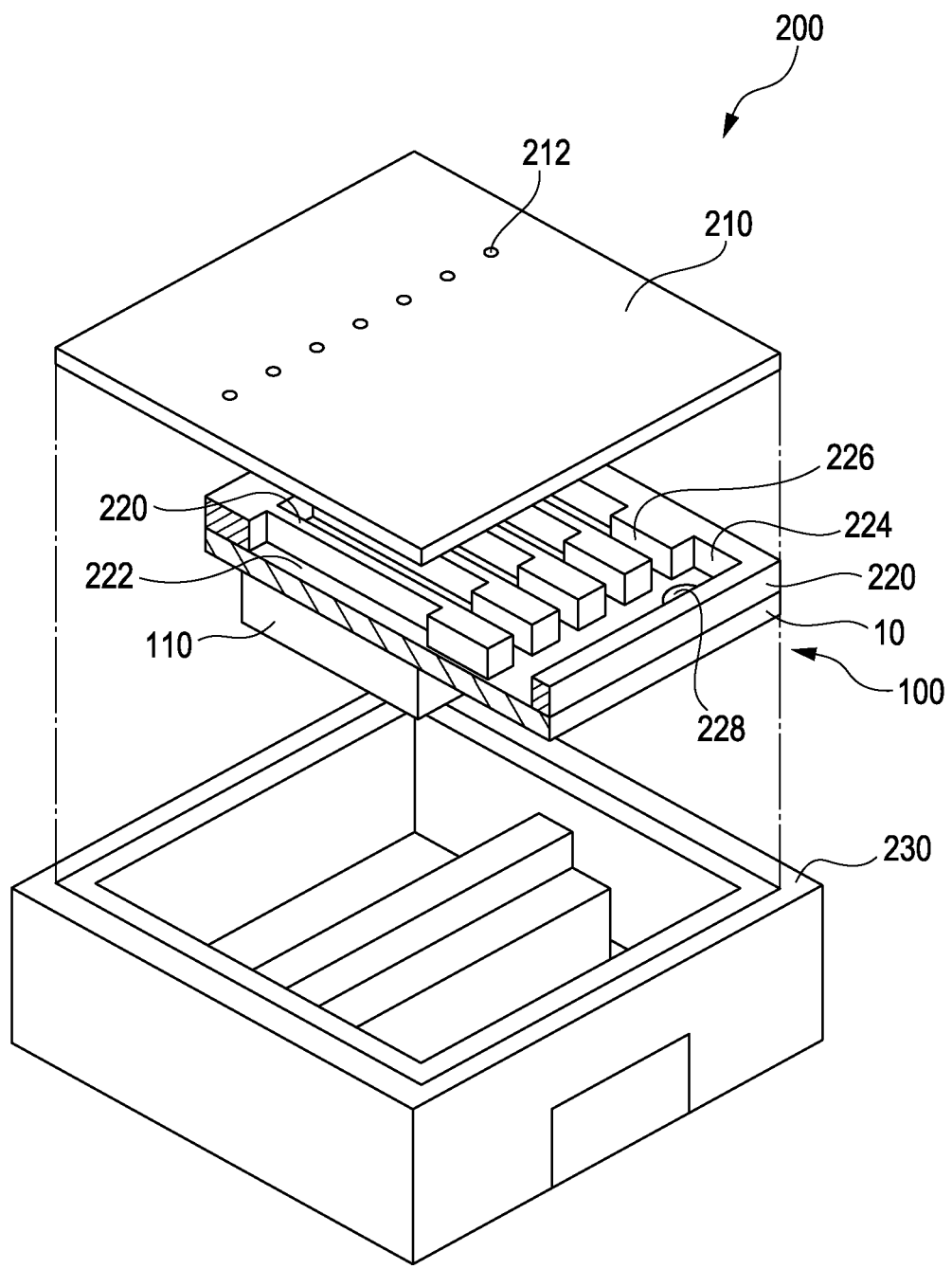
FIG. 8 is an exploded perspective view schematically illustrating the liquid ejecting head according to the embodiment.

Next, a liquid ejecting head 200 in which the piezoelectric device according to the invention functions as a piezoelectric actuator will be described with reference to the drawings. FIG. 7 is a cross-sectional diagram schematically illustrating a principal portion of the liquid ejecting head 200. FIG. 8 is an exploded perspective view of the liquid ejecting head 200 illustrated upside down with respect to the state in which the liquid ejecting head 200 normally operates.

The liquid ejecting head 200 includes the piezoelectric device according to the invention. An example below is explained in detail of the liquid ejecting head 200 that includes the piezoelectric device 100 as the piezoelectric device according to the invention. As describe above, in the case where the piezoelectric device 100 functions as the piezoelectric actuator 102, the substrate 10 has flexibility and serves as a vibration plate which deforms in response to the operation of the first piezoelectric element 30 and the second piezoelectric element 50.

The liquid ejecting head 200, as shown in FIGS. 7 and 8, includes a nozzle plate 210 in which nozzle holes 212 are arranged, a passage substrate 220 to provide a passage 222, and the piezoelectric device 100 (the piezoelectric actuator 102). The liquid ejecting head 200, in addition, may have a housing 230 shown in FIG. 8. Note that a multilayer structure 110 (including the first electrode 20, the first piezoelectric element 30, the low density region 40, the second piezoelectric element 50, and the second electrode 60) of the piezoelectric device 100 is simplified and illustrated in FIG. 8.

The nozzle holes 212 are arranged in the nozzle plate 210 as shown in FIGS. 7 and 8. Ink is ejected from the nozzle holes 212. In the nozzle plate 210, a number of nozzle holes 212 are arranged in a row, for example. Silicone, stainless steel (SUS), or the like can be used as a material of the nozzle plate 210.

The passage substrate 220 is disposed on the nozzle plate 210 (beneath the nozzle plate 210 in FIG. 8). Material such as silicone can be used as a material of the passage substrate 220. The passage substrate 220 separates space between the nozzle plate 210 and the substrate 10 to provide a manifold 224 (which can be referred to as, for example, a liquid reservoir), and a passage 222 (which can be referred to as, for example, a pressure chamber) communicating with the manifold 224, as shown in FIG. 8. In other words, the manifold 224 and the passage 222 are separated by the nozzle plate 210, the passage substrate 220 and the substrate 10. As shown in FIG. 8, for example, the manifold 224 and the passage 222 may communicate with each other through a supply port 226. The manifold 224 can temporarily store the ink supplied from the outside (an ink cartridge, for example) via a through-hole 228 which is disposed in the substrate 10. The ink in the manifold 224 is supplied to the passage 222. The capacity of the passage 222 changes in response to the deformation of the substrate 10. The passage 222 communicates with the nozzle holes 212, from which ink is ejected in accordance with the capacity change of the pressure chamber 222. The passage 222 can be provided corresponding to the piezoelectric device 100.

The piezoelectric device 100 is disposed on the passage substrate 220 (beneath the passage substrate 220 in FIG. 8). The multilayer structure 110 is electrically connected to a piezoelectric device driving circuit (not shown) and operates (vibrates or deforms) according to a signal supplied from the piezoelectric device driving circuit. The substrate 10 is caused to deform by the operation of the multilayer structure 110 (the first piezoelectric element 30 and the second piezoelectric element 50) and instantaneously raises the internal pressure of the passage 222.

The housing 230 houses the nozzle plate 210, the passage substrate 220 and the piezoelectric device 100, as shown in FIG. 8. As a material of the housing 230, material such as a resin or metal can be used.

The liquid ejecting head 200 of the embodiment includes the piezoelectric device 100, thereby achieving high reliability.

The above embodiment describes the case in which the liquid ejecting head 200 is an ink jet-type recoding head. However, the liquid ejecting head of the invention can be used, for example, as a color material ejection head used in manufacturing color filters for a liquid crystal display or the like, an electrode material ejection head used in forming electrodes of an organic EL display, a surface-emitting display (FED) or the like, an organic living body ejection head used in producing biochips, and so on.

Liquid Ejecting Apparatus

Figure 9:
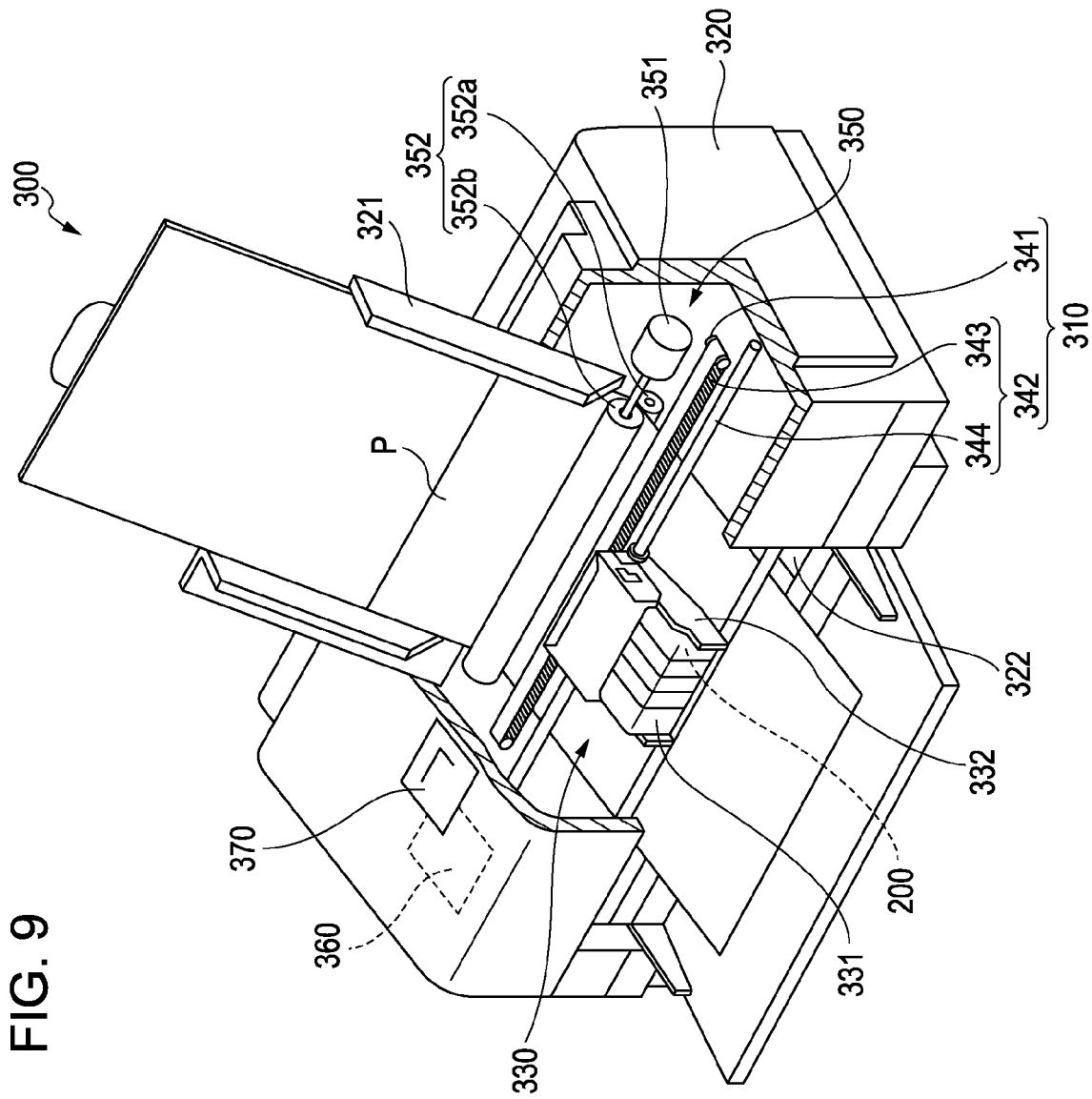
FIG. 9 is a perspective view schematically illustrating a liquid ejecting apparatus according to an embodiment of the invention.

Next, a liquid ejecting apparatus 300 according to an embodiment of the invention will be described with reference to the drawings. FIG. 9 is a perspective view schematically illustrating the liquid ejecting apparatus 300. The liquid ejecting apparatus 300 includes the liquid ejecting head according to the invention. Hereinafter, the case in which the liquid ejecting apparatus 300 is an ink jet printer will be described.

As shown in FIG. 9, the liquid ejecting apparatus 300 includes a head unit 330, a drive section 310, and a control section 360. The liquid ejecting apparatus 300 may further include a main body 320, a paper feeder 350, a tray 321 on which recording paper P is set, a discharge port 322 through which the recording paper P is discharged, and an operation panel 370 arranged on an upper surface of the main body 320.

The head unit 330 includes, for example, an ink jet-type recording head which is configured of the aforementioned liquid ejecting head 200 (hereinafter, simply referred to as "head" as well). The head unit 330 further includes an ink cartridge 331 which supplies ink to the head, and a transport section (carriage) 332 on which the head and the ink cartridge 331 are mounted.

The drive section 310 can reciprocate the head unit 330. The drive section 310 includes a carriage motor 341 which is a driving source for the head unit 330 and a reciprocating mechanism 342 which reciprocates the head unit 330 by the rotation of the carriage motor 341.

The reciprocating mechanism 342 includes a carriage guide shaft 344 both ends of which are supported by a frame (not shown) and a timing belt 343 that stretches in parallel with the carriage guide shaft 344. The carriage guide shaft 344 supports the carriage 332 so that the carriage 332 can suitably reciprocate. In addition, the carriage 332 is fixed to part of the timing belt 343. When the timing belt 343 is driven by operation of the carriage motor 341, the head unit 330 reciprocates along the carriage guide shaft 344. Upon the reciprocating movement of the head unit 330, ink is ejected appropriately and printing onto the recording paper P is performed.

The embodiment illustrates an example in which both the liquid ejecting head 200 and the recording paper P move in performing the printing operation. However, the liquid ejecting apparatus of the invention may have a printing mechanism in which the liquid ejecting head 200 and the recording paper P change their positions relatively to each other in performing the printing onto the recording paper P. Moreover, although in the embodiment, an example of performing the printing onto the recording paper P is described, a recording medium onto which printing is performed is not limited to paper. A wide range of media such as cloth, film, and metal can be used as a recording medium, and the configuration of the liquid ejecting apparatus can be appropriately changed in accordance with the selected recording medium.

The control section 360 controls the head unit 330, the drive section 310, and the paper feeder 350.

The paper feeder 350 feeds the recording paper P from the tray 321 toward the head unit 330. The paper feeder 350 includes a feed motor 351 which is a driving source thereof and a feed roller unit 352 which is rotated by operation of the feed motor 351. The feed roller unit 352 has a driven roller 352a and a driving roller 352b. The driven roller 352a and the driving roller 352b face each other pinching the recording paper P in the feed path, where the driving roller 352b is placed above the driven roller 352a. The driving roller 352b is linked to the feed motor 351. When the paper feeder 350 is driven by the control section 360, the recording paper P is fed so as to pass under the head unit 330.

The head unit 330, the drive section 310, the control section 360, and the paper feeder 350 are arranged in the main body 320.

The liquid ejecting apparatus 300 includes the liquid ejecting head 200, whereby the liquid ejecting apparatus 300 may have high reliability.

The liquid ejecting apparatus of the embodiment described above has one liquid ejecting head with which the printing is performed onto the recording paper P. The apparatus may have a plurality of liquid ejecting heads. In the case where the liquid ejecting apparatus has a plurality of liquid ejecting heads, each of the plurality of ejecting heads may operate independently of each other as in the case of one liquid ejecting head described above, or the plurality of liquid ejecting heads operate in cooperation with each other and may function as one integrated liquid ejecting head. An example of such an integrated liquid ejecting head is a line-type head in which each of the nozzle holes of the plurality of liquid ejecting heads is disposed at a uniform interval as a whole.

As an example of the liquid ejecting apparatus according to the invention, an ink jet recording apparatus that is herein an ink jet printer has been explained in the embodiment. The liquid ejecting apparatus of the invention can be used in industrial fields. In this case, as a liquid to be ejected (liquid material), a material such as the one formed of various functional materials, viscosity of which is adjusted to an appropriate value by a solvent, dispersion medium or the like, can be used. In addition to being used in image recording apparatuses such as printers mentioned above, the liquid ejecting apparatus according to the invention can be appropriately used in such apparatuses as a color material ejection apparatus used in manufacturing color filters for a liquid crystal display or the like, a liquid material ejection apparatus used in forming electrodes or color filters of an organic EL display, a surface-mitting display (FED), an electrophoresis display or the like, and an organic living body ejection apparatus used in producing biochips.

Although the embodiments of the invention have been explained in detail thus far, those skilled in the art will easily recognize that various changes can be made without departing from the spirit and scope of the invention; therefore, it is to be understood that such changes are covered within the spirit and scope of the invention.

What is claimed is:

1. A piezoelectric device defining an X direction, a Y direction generally transverse to the X direction, and a Z direction generally transverse to the X and Y directions, the piezoelectric device comprising:
    a substrate disposed at a first layer in the Z direction;
    a first electrode disposed at a second layer, the second layer being disposed above the first layer in the Z direction, the first electrode being disposed above the substrate in the Z direction;
    a first piezoelectric element disposed at a third layer, the third layer being disposed above the second layer in the Z direction, the first piezoelectric element being disposed above the first electrode in the Z direction;
    a low density region disposed at the third layer, alongside the first piezoelectric element in an X-Y plane, wherein the low density region is disposed substantially at a same height in the Z direction as a height in the Z direction of the first piezoelectric element, wherein the low density region has density lower than a density of the first piezoelectric element;
    a second piezoelectric element which covers the first piezoelectric element and the low density region; and
    a second electrode disposed above the second piezoelectric element in the Z direction.

2. The piezoelectric device according to claim 1,
    wherein a side surface of the first piezoelectric element slants at a first angle relative to an upper surface of the substrate;
    a side surface of the first electrode slants at a second angle relative to the upper surface of the substrate; and
    the first angle is larger than the second angle.

3. The piezoelectric device according to claim 1, wherein the low density region has voids therein.

4. A piezoelectric actuator comprising: the piezoelectric device according to claim 1.

5. A liquid ejecting head comprising: the piezoelectric actuator according to claim 4.

6. A liquid ejecting apparatus comprising: the liquid ejecting head according to claim 5.

7. A method for manufacturing a piezoelectric device, the piezoelectric device defining an X direction, a Y direction generally transverse to the X direction, and a Z direction generally transverse to the X and Y directions, the method comprising:
    depositing a first electrode layer above a substrate in the Z direction, the substrate being disposed at a first layer in the Z direction and the first electrode layer being disposed at a second layer above the first layer in the Z direction;
    depositing a first piezoelectric element layer above the first electrode layer in the Z direction, the first piezoelectric element layer being disposed at a third layer above the second layer in the Z direction;
    forming a first piezoelectric element through patterning the first piezoelectric element layer;
    forming a low density region, through heat treating, alongside the first piezoelectric element, wherein the low density region is disposed at the third layer, alongside the first piezoelectric element in an X-Y plane, wherein the low density region is disposed substantially at a same height in the Z direction as a height in the Z direction of the first piezoelectric element, wherein the low density region has density lower than a density of the first piezoelectric element;
    forming a first electrode, following the forming of the first piezoelectric element, through etching the first electrode layer;
    depositing a second precursor layer that covers the first piezoelectric element and the first electrode;
    forming a second piezoelectric element layer through heat-treating and crystallizing the second precursor layer;
    depositing a second electrode layer over the second piezoelectric element layer; and
    forming a second piezoelectric element and a second electrode that cover the first piezoelectric element and the first electrode, through patterning the second piezoelectric element layer and the second electrode layer,
    wherein in the forming of the first piezoelectric element, a side surface of the first piezoelectric element is made slanted at a first angle relative to an upper surface of the substrate;
    in the forming of the first electrode, a side surface of the first electrode is made slanted at a second angle relative to the upper surface of the substrate; and
    the first angle is larger than the second angle.

* * * * *